United States Patent
Wu et al.

(10) Patent No.: US 7,785,906 B2
(45) Date of Patent: Aug. 31, 2010

(54) METHOD TO DETECT POLY RESIDUES IN LOCOS PROCESS

(75) Inventors: Xiaoju Wu, Irving, TX (US); Jozef Czeslaw Mitros, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 173 days.

(21) Appl. No.: 11/954,773

(22) Filed: Dec. 12, 2007

(65) Prior Publication Data

US 2009/0153174 A1  Jun. 18, 2009

(51) Int. Cl.
*G01R 31/26* (2006.01)
*H01L 21/66* (2006.01)

(52) U.S. Cl. ............................ 438/17; 438/14; 438/18; 257/48; 257/E21.521; 257/E21.522; 257/E21.524; 257/E21.525; 257/E21.526; 257/E21.529; 257/E21.53; 257/E21.531

(58) Field of Classification Search .................. 257/48, 257/E21.521, E21.522, E21.524, E21.525, 257/E21.526, E21.529, E21.53, E21.531; 438/14, 17, 18; 324/765

See application file for complete search history.

(56) References Cited

U.S. PATENT DOCUMENTS 5,742,075 A * 4/1998 Burns et al. .................. 257/59
2009/0020754 A1* 1/2009 Suryagandh et al. .......... 257/48

* cited by examiner

*Primary Examiner*—Matthew C Landau
*Assistant Examiner*—Jessica Hall
(74) *Attorney, Agent, or Firm*—Warren L. Franz; Wade J. Brady, III; Frederick J. Telecky, Jr.

(57) ABSTRACT

A test structure which can be used to detect residual conductive material such as polysilicon which can result from an under etch comprises a PMOS transistor and an OTP EPROM floating gate device. By testing the devices using different testing parameters, it can be determined whether residual conductive material remains subsequent to an etch, and where the residual conductive material is located on the device. A method for testing a semiconductor device using the test structure is also described.

19 Claims, 7 Drawing Sheets

METHOD TO DETECT POLY RESIDUES IN LOCOS PROCESS

FIELD OF THE INVENTION

This invention relates to the field of semiconductor device processing. More particularly, a method and structure which can be used to detect conductive residues is disclosed.

BACKGROUND OF THE INVENTION

During semiconductor device processing, various structures are formed using a variety of materials and technologies. P-channel metal oxide semiconductor (PMOS) devices, n-channel MOS (NMOS) devices, erasable programmable read-only memory (EPROM) devices, resistors, capacitors, etc., can be formed using known processing techniques.

Photolithography is commonly used to form structures such as polysilicon transistor gates (control gates), for example gates for one time programmable (OTP) EPROMs and p-channel and n-channel MOS devices. Due to the very large number of these structures formed with a typical memory device, even a minimal decrease in the width of the control gate can significantly decrease the size of the completed device. Miniaturization of transistor gate "line widths" is, therefore, a particular concern to design engineers. However, the formation of these increasingly narrow control gates across larger substrates using photolithography is becoming ever more difficult. This is particularly true with OTP EPROMs, which have transistor gates which are typically narrower than MOS gates.

When small, closely spaced features are etched at the same time as larger, widely spaced features, it is difficult to complete the etch in the narrow regions without overetching the wide regions. Thus the material in the narrow regions may not be completely removed, or the material in the wide regions may be overetched. This is referred to as the "micro-loading effect."

Additionally, uneven (non-planar) topography increases the difficulty in clearing conductive materials during an etch, particularly in narrow regions. Uneven topography is especially severe in fabrication of devices using the local oxidation of silicon (LOCOS). FIG. 1 depicts an in-process device formed using a LOCOS process, and comprises the following structures: semiconductor wafer 10 doped to an n-type conductivity; PMOS transistor source region 12 and drain region 14 doped to a p-type conductivity; field isolation (field oxide) 16 formed using a LOCOS process; gate isolation (gate oxide) 18; PMOS transistor gate comprising polysilicon 20 and silicide 22; dielectric spacers 24; interlayer dielectric 26 typically comprising tetraethyl orthosilicate (TEOS) and/or borophosphosilicate glass (BPSG); conductive source contact 28, and; conductive drain contact 30. Various other features can be present in a production device which are not depicted or described for simplicity of explanation.

The FIG. 1 device has been formed successfully. However, due to micro-loading or errors in photolithography, the structures of FIGS. 2 and 3 can result. In the FIG. 2 structure, the transistor gate polysilicon 20 and silicide 22 have not been properly cleared from the drain side during an etch which forms the transistor gate, and the conductive drain contact 30 is shorted to the transistor gate silicide 22 and polysilicon 20. In the FIG. 3 structure, the transistor gate polysilicon 20 and silicide 22 have not been properly cleared from either the drain side or the source side, which results in the shorting of the drain contact 30 to source contact 28 through (and with) the transistor gate silicide 22.

Various test structures are used during semiconductor device fabrication to ensure that the features which are formed are within engineering tolerances and to test for contamination. One structure which is used to test whether features are formed within engineering tolerances is referred to as a "serpentine/comb" structure 40, depicted in FIG. 4. This particular structure comprises a pair of interdigitated "comb" features 42, 44, with an intertwining "serpentine" feature 46 overlying a large doped "moat" region 48. An attempt is made to form this test structure on a test or production wafer, then the test structure can be visually inspected to determine whether the process has been successful. If errors in the serpentine/comb are detected, the manufacturing process may be altered or the wafer may be reworked. This structure is formed to a relatively large size and is used primarily to detect particulate contamination. Thus it has limited success in detecting formation problems resulting from lithography or etching errors in very small polysilicon structures.

There remains a need for additional test tools which reliably determine whether structures formed during device processing are properly formed within engineering tolerances.

SUMMARY OF THE EMBODIMENTS

One exemplary embodiment of a test structure for a semiconductor device includes at least a portion of a semiconductor wafer and a metal oxide semiconductor (MOS) device having a source, a drain, and a transistor gate. The test structure further includes a one time programmable floating gate transistor having a source, a drain, and a floating gate. Also included are various probe contacts, with a first probe contact electrically coupled with the sources of both the MOS device and the floating gate device, a second probe contact electrically coupled with the drain of the MOS device, and a third probe contact electrically coupled with the transistor gate of the MOS device. A fourth probe contact is electrically coupled with the drain of the floating gate transistor, and a fifth probe contact is electrically coupled with the semiconductor wafer.

Further described is a method for testing a semiconductor device, including providing a test structure having a MOS transistor and a floating gate transistor, applying voltages to the MOS transistor which are sufficient to activate a functional MOS transistor, and applying voltages to the MOS transistor which are not sufficient to activate a functional MOS transistor. Voltages are then applied to the floating gate transistor which are not sufficient to activate a functional unprogrammed floating gate transistor, then voltages are applied to the floating gate transistor which are sufficient to program a functional floating gate transistor. Subsequently, voltages are applied to the floating gate transistor which are sufficient to activate a functional programmed floating gate transistor.

In another embodiment, a method used to test for residual conductive material on a semiconductor device resulting from an under etch of the conductive material includes providing a test structure having a p-type metal oxide semiconductor (PMOS) transistor, a one time programmable (OTP) erasable programmable read-only memory (EPROM) comprising a source, a drain, a channel, and a floating gate. Further provided is a back gate interposed between the OTP EPROM and the PMOS transistor. The PMOS transistor is tested for functionality and, if it is not functional, the semiconductor device is failed for having gross failures. If the PMOS transistor is functional, prior to programming the OTP EPROM, a first test voltage of about −1.0 V is applied to the OTP EPROM drain and about 0.0 V to both the back gate and the OTP EPROM source. If current through the OTP EPROM channel during the application of the first test voltage is less than about 1.0 microamp (μA) or more than about 100 μA, the semiconductor device is failed. If current through the OTP EPROM channel during application of the first test voltage is between about 1.0 μA and about 100 μA, the OTP EPROM is programmed. Subsequently, a second test voltage of about 1.0 V applied to the OTP EPROM drain and about 0.0 V applied to both the back gate and the OTP EPROM source is used to test the OTP EPROM. If current through the OTP EPROM channel during the application of the "I on" voltage is less than about 10 μA or more than about 100 μA, the semiconductor device is failed.

BRIEF DESCRIPTION OF THE DRAWINGS

The accompanying drawings, which are incorporated in and constitute a part of this specification, illustrate embodiments of the invention and together with the description, serve to explain the principles of the invention. In the figures.

DESCRIPTION OF THE EMBODIMENTS

Reference will now be made in detail to the present embodiments (exemplary embodiments) of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected.

According to various embodiments, a test structure can be formed over the surface of a semiconductor wafer which can be used to test whether a conductive material such as silicide and/or polysilicon has been properly etched at small feature locations, or whether gross processing errors are present. If residual conductive material remains, an embodiment of the invention can indicate whether the residual polysilicon remains on only one of a source side and a drain side of a transistor having a narrow gate width, such as a one time programmable erasable programmable read-only memory (OTP EPROM), or on both the source and drain side.

Figure 5:
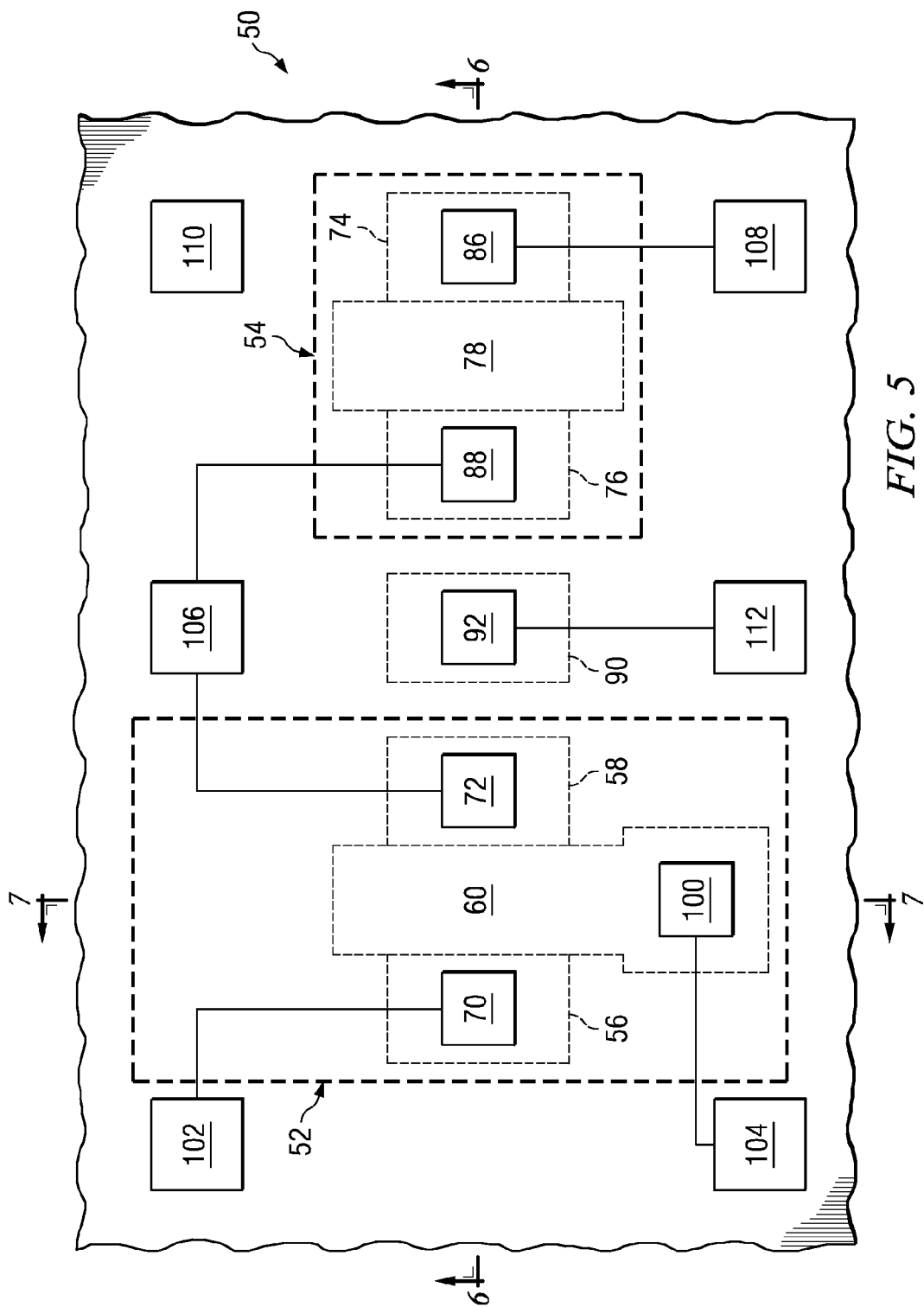
FIG. 5 is a combined schematic/plan view of an embodiment of the invention.
Figure 6:
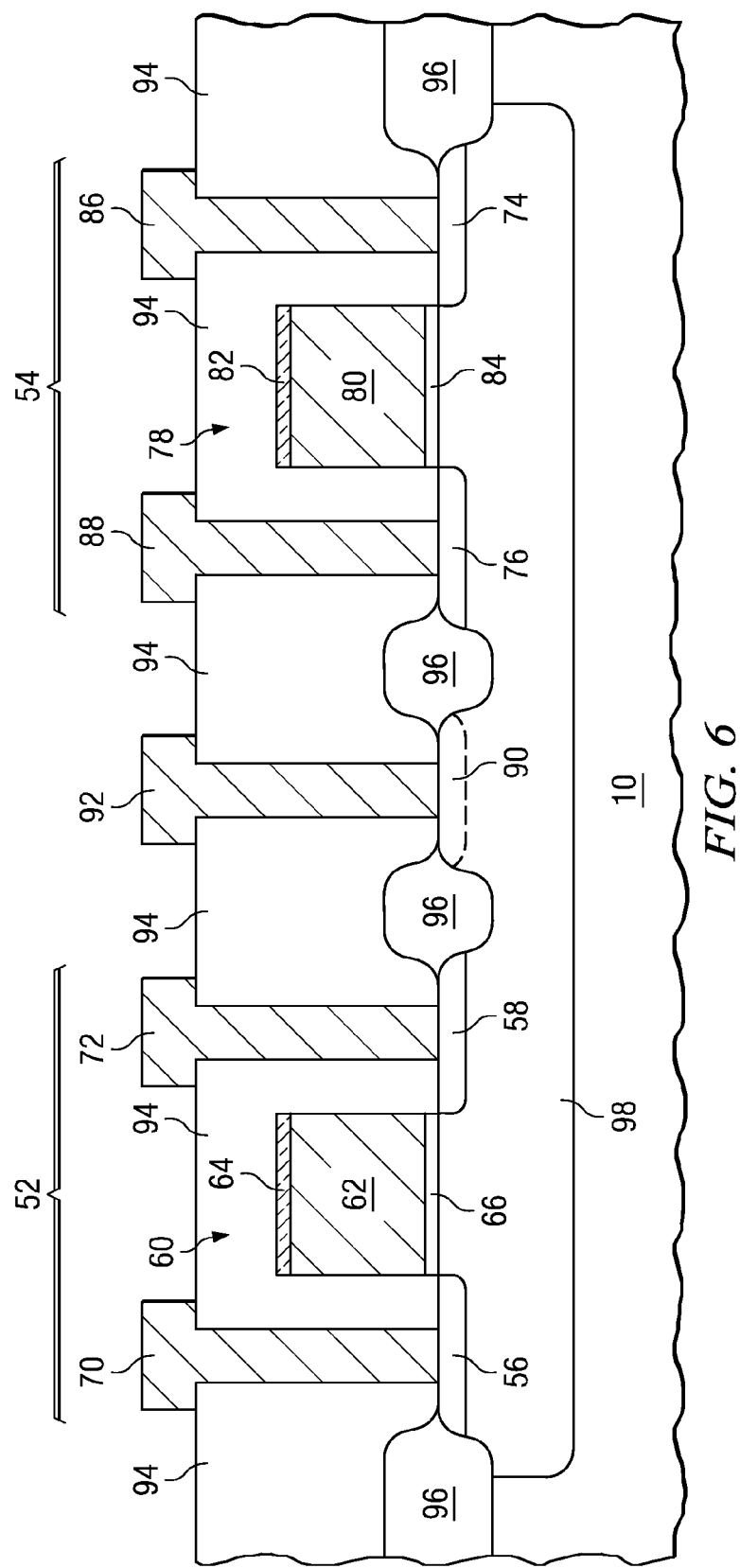
FIG. 6 is a cross section along line 6-6 of the FIG. 5 structure.
Figure 7:
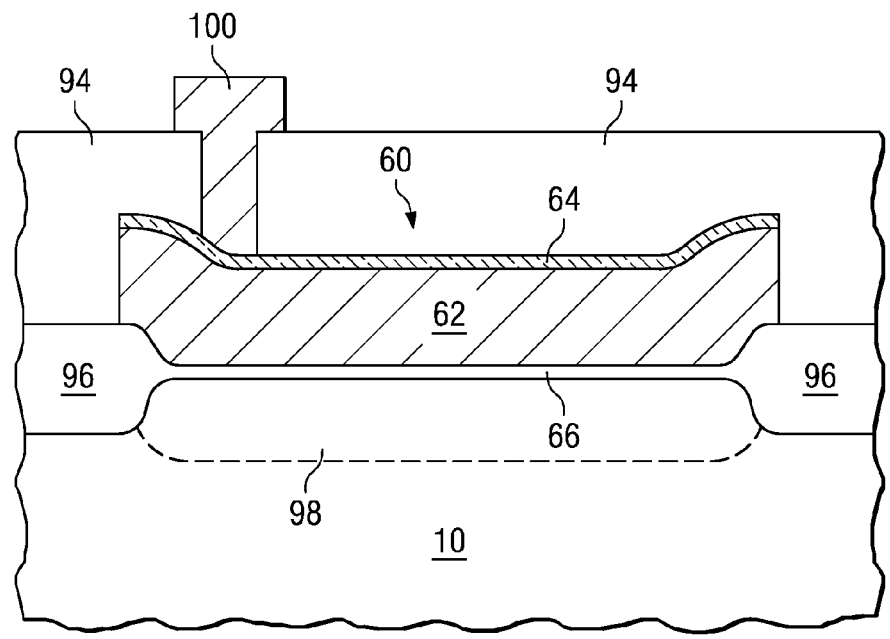
FIG. 7 is a cross section along line 7-7 of the FIG. 5 structure.

FIG. 5 depicts a combined schematic/plan view of an exemplary embodiment of the invention, with FIG. 6 depicting a cross section along line 6-6 of FIG. 5, and FIG. 7 depicting a cross section along line 7-7 of FIG. 5.

The exemplary structures of FIGS. 5-7 can include a test structure 50 over at least a portion of a semiconductor wafer 10 which can be doped to a p-type conductivity. This embodiment of the test structure 50 includes a PMOS transistor device 52 and an OTP EPROM device 54. The PMOS transistor device 52 includes: a drain region 56 doped to a p-type conductivity; a source region 58 doped to a p-type conductivity; a conductive transistor gate 60 comprising a polysilicon portion 62 and a silicide portion 64; and gate dielectric (gate oxide) 66. Test structure 50 further includes a drain contact 70 to the PMOS drain region 56 and a source contact 72 to the PMOS source region 58.

The OTP EPROM device 54 can include a drain region 74 doped to a p-type conductivity; a source region 76 doped to a p-type conductivity; a conductive transistor floating gate 78 comprising a polysilicon portion 80 and a silicide portion 82, and; gate dielectric (tunnel oxide) 84. Test structure 50 can further include a drain contact 86 to the OTP EPROM drain region 74; a source contact 88 to the OTP EPROM source region, an n+back gate 90 for the PMOS transistor 52 and the OTP EPROM device 54 and interposed therebetween; a back gate contact 92 to the back gate 90; interlayer dielectric 94; LOCOS field dielectric (field oxide) 96; n-well 98, and; PMOS gate contact 100 which connects to the conductive PMOS transistor gate 60.

FIG. 5 further depicts probe pads which allow external connection to various elements of the test structure 50 as depicted in FIGS. 5-7. Various elements of the test structure 50 can be biased and/or measured through these probe pads during wafer testing. Probe pad 102 can be electrically coupled with the PMOS drain 56 through the PMOS drain contact 70 and probe pad 104 can be electrically coupled with the PMOS transistor gate 60 through the PMOS transistor contact 100. In this embodiment of the invention, the MOS transistor gate has no other direct electrical connections. Probe pad 106 can be electrically coupled with the PMOS source 58 through PMOS source contact 72 and with the OTP EPROM source 76 through the OTP EPROM source contact 88. Probe pad 108 can be electrically coupled with OTP EPROM drain 74 through the OTP EPROM drain contact 86 and probe pad 110 can be electrically coupled with the p-type substrate of wafer 10. Finally, probe pad 112 can be electrically coupled with the back gate 90 through back gate contact 92. Table 1 references the structures connected with each of the probe pads numbered in FIG. 5.

TABLE 1

Probe Pad Connections for the Test Structure of FIG. 5

| Probe Pad (FIG. 5) | Structure connected |
|---|---|
| 102 | PMOS Drain (56) |
| 104 | PMOS Gate (60) |
| 106 | PMOS Source (58) and OTP EPROM Source (76) |
| 108 | OTP EPROM Drain (74) |
| 110 | P-type Substrate of Wafer (10) |
| 112 | Back gate (90) |

In this embodiment, the PMOS transistor 52 can be formed to a larger size than the OTP EPROM device 54, though for simplicity it is depicted approximately the same size in the accompanying FIGS. The gate width of the PMOS transistor will be at least about two times the width of the OTP EPROM, and can be larger than two times the width. With current technology, typical PMOS transistor line widths are in the range of about 10 micrometer (μm) to about 20 μm. However, if the width is excessively large it becomes difficult to measure drain current because standard equipment allows measurement up to about 100 μA. A typical OTP EPROM floating gate for the present embodiment of the invention with current technology can be about 0.7 μm long and about 0.9 μm wide. A minimum OTP EPROM floating gate size for current technology is about 0.4 μm long for a transistor with 75 angstrom (Å) thick tunnel oxide, and about 0.6 μm long for a transistor with 125 Å thick tunnel oxide. In either case, the floating gate can be about 0.9 μm wide.

It should be understood that the structure of FIGS. 5-7 and the associated description are merely one possible embodiment of the invention. Various other materials and structural arrangements may be evident to one of ordinary skill in the art without departing from the scope of the claimed invention.

Figure 1:
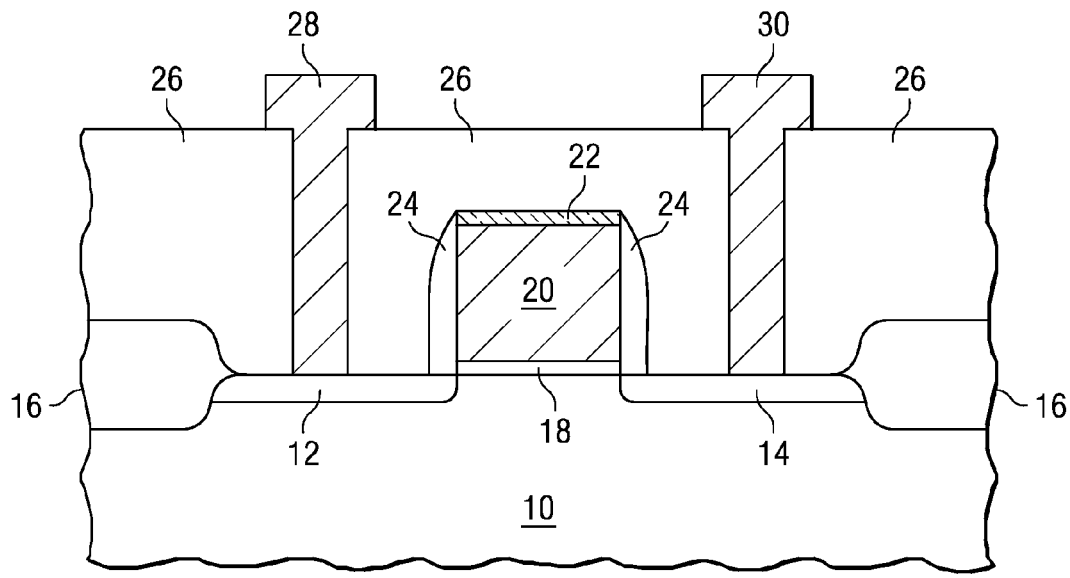
FIG. 1 (Prior Art) is a cross section of a conventional PMOS transistor formed using a LOCOS process.
Figure 2:
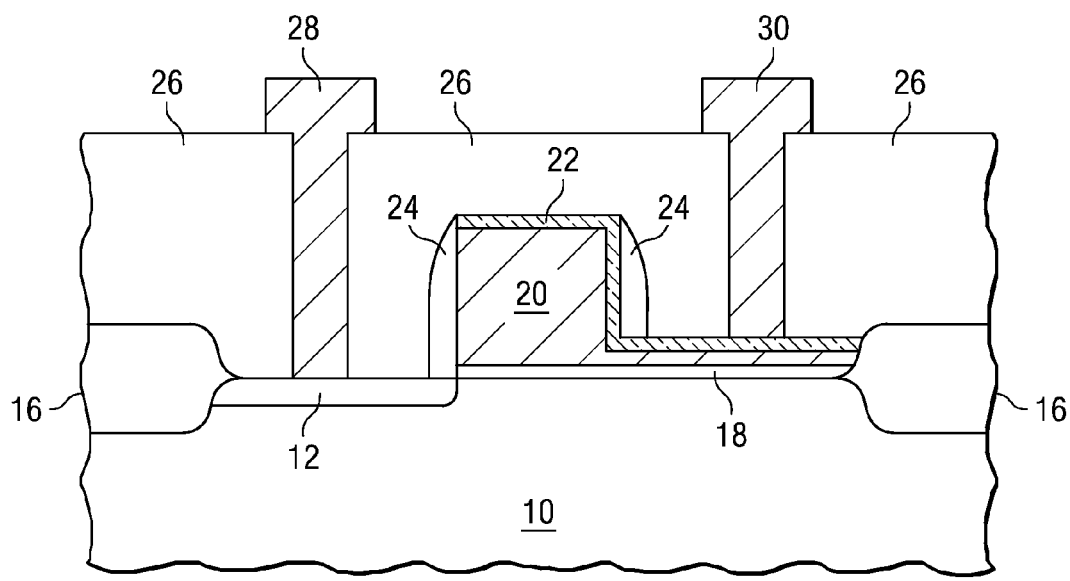
FIG. 2 (Prior Art) is a cross section of a conventional PMOS transistor formed using a LOCOS process, and depicts an unsuccessful etch which has failed to clear conductive transistor gate portions from a drain side of the device, resulting in a short between the transistor gate and the drain contact.
Figure 3:
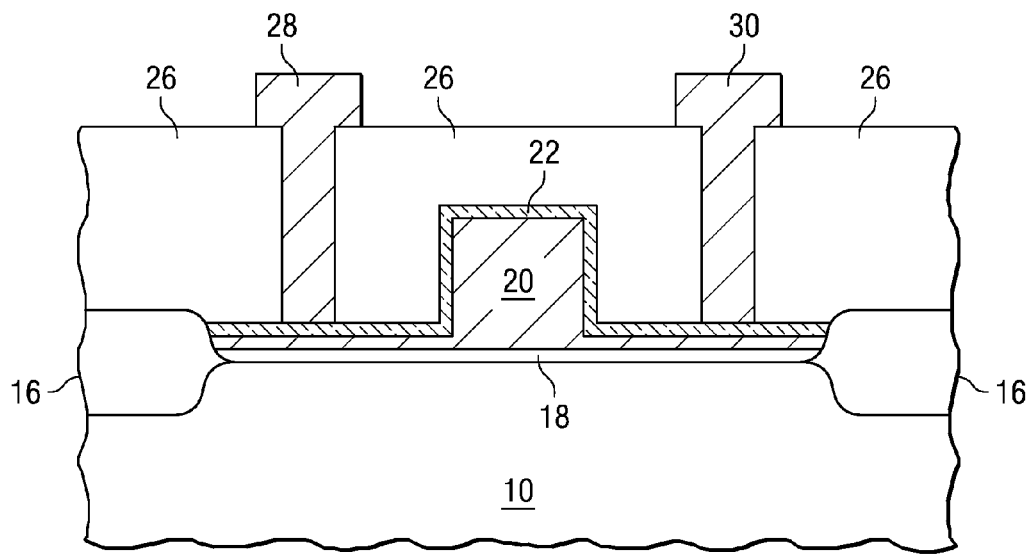
FIG. 3 (Prior Art) is a cross section of a conventional PMOS transistor formed using a LOCOS process, and depicts an unsuccessful etch which has failed to clear conductor transistor gate portions from both a source side and a drain side of the device, resulting in a short between a source contact and a drain contact through (and with) the transistor gate.
Figure 4:
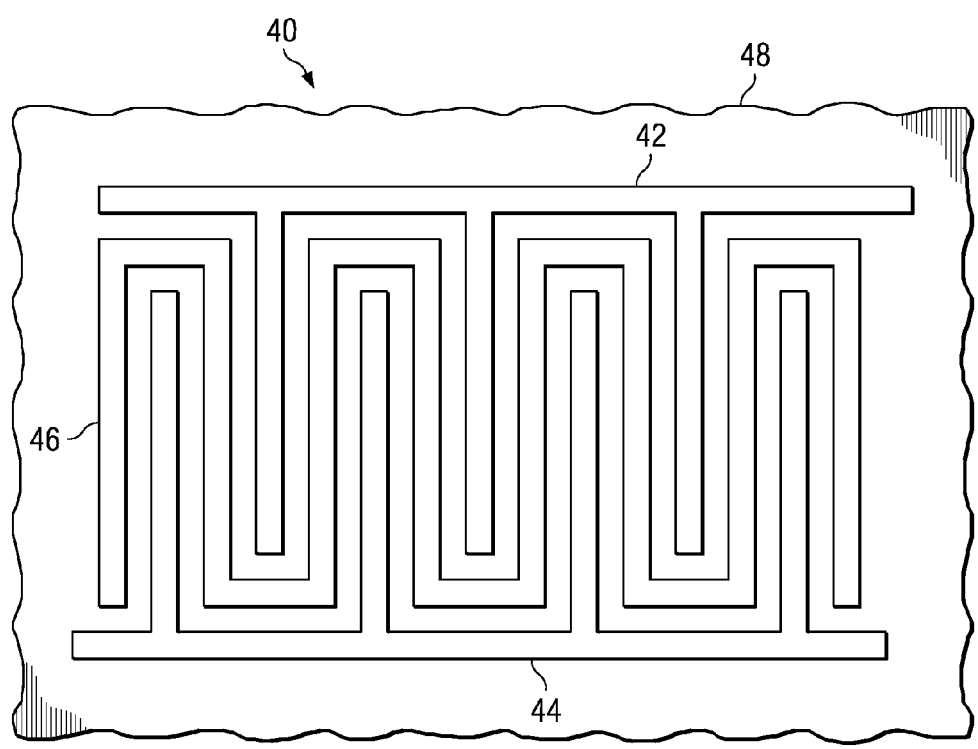
FIG. 4 (Prior Art) is a conventional test structure used to detect processing errors.

Various tests can be performed on the structure depicted in FIGS. 5-7, the results of which can be indicative of wafer processing errors such as those depicted in FIGS. 2 and 3. Various tests which can be performed on test structure 50 are described below.

Table 2 lists various exemplary voltages which can be applied to the probe pads of the test structure 50 of FIG. 5, where "$V_d$" is the voltage applied to the drain of either the PMOS transistor or the OTP EPROM as indicated, "$V_g$" is the voltage applied to the control gate of the PMOS transistor (the OTP EPROM does not have a control gate), "$V_s$" is the voltage applied to the source of the device indicated, and "$V_{bg}$" is the voltage applied to the back gate during testing. These voltages can be modified as required for various device sizes, layer thicknesses, the actual implementation of the invention, etc.

TABLE 2

Exemplary Test Voltages

| Test Parameter | Device | Vd | Vg | Vs | Vbg | Expected Result for Functional Device |
|---|---|---|---|---|---|---|
| $I_{ds}$ off | PMOS transistor | −3.3 | 0.0 | 0.0 | 0.0 | No Conduction |
| $I_{ds}$ on | PMOS transistor | −3.3 | −3.3 | 0.0 | 0.0 | Conduction |
| I off | OTP EPROM | −1.0 | n/a | 0.0 | 0.0 | 1 μA < $I_{ds}$ > 100 μA |
| I prog | OTP EPROM | −7.0 | n/a | 0.0 | 0.0 | OTP EPROM is Programmed |
| I on | OTP EPROM | −1.0 | n/a | 0.0 | 0.0 | 10 μA < $I_{ds}$ > 100 μA |

The first three test parameters, "$I_{ds}$ off," "$I_{ds}$ on," and "I off" can be performed prior to programming the OTP EPROM, the fourth test parameter "I prog" programs the OTP EPROM, and the fifth test parameter "I on" tests the programmed OTP EPROM. In one exemplary use of the inventive test structure of FIG. 5, the voltages are applied in sequential order as listed. Each procedure is described below.

The first two test parameters are used to test functionality of the PMOS transistor. With test parameter "$I_{ds}$ off," −3.3 volts (V) can be applied to the PMOS drain while grounding the PMOS gate, source, and the back gate and measuring current flow. Using these voltages, the PMOS transistor should not conduct across its channel (i.e. should not "activate," "trip," or "turn on"). With test parameter "$I_{ds}$ on," −3.3 V can be applied to the PMOS drain and gate, while the PMOS source and the back gate are grounded and current flow is measured. In a functional PMOS transistor, these voltages result in conduction across the channel (i.e. the device will "activate," "trip," or "turn on").

Test parameters "$I_{ds}$ off" and "$I_{ds}$ on" are used to ensure functionality of the PMOS transistor. Because the PMOS transistor can be at least twice as large as the OTP EPROM device, it can be easier to form and should be functional. If the PMOS transistor fails one of these two initial tests, the semiconductor device can be failed for comprising gross processing errors and can be reworked, if possible. Improper operation of the PMOS transistor indicates a likely gross processing failure not related to residual polysilicon, but which could result in failure of the OTP EPROM. If the PMOS transistor was not included in test structure 50, a failing OTP EPROM could indicate either a gross processing error or residual polysilicon. However, with both a PMOS transistor and an OTP EPROM as part of test structure 50, if the PMOS transistor is functional and the OTP EPROM is not functional, then residual polysilicon is indicated while a gross processing error is not.

After ensuring functionality of the PMOS transistor using parameters "$I_{ds}$ off" and "$I_{ds}$ on," the unprogrammed OTP EPROM can be tested using the third test parameter, "I off." This test uses the application of −1.0 V to the OTP EPROM drain and 0.0 V to both the source and the back gate while measuring current. The measured drain current, I off=$I_{ds}$ (Vd=1.0V) should be significantly less than 1.0 microampere (μA), which indicates the device has not turned on. If current I off is higher than 1.0 μA, it is likely that the drain and source are shorted together by residual polysilicon covering both the source and drain.

If the OTP EPROM passes "I off," it can be programmed using the application of the voltages listed for "I prog", −7.0 V on the drain and 0.0 V on both the source and the back gate.

This will result in hot electrons injected through the tunnel dielectric and onto the floating gate, thereby programming the device.

After programming the OTP EPROM, the final test "I on" can be performed by applying −1.0 V to the drain and 0.0 V to both the source and the back gate. A functional OTP EPROM should result in a drain current $I_{dp}$ of between about 10 μA and about 100 μA, and more particularly between about 25 μA and about 75 μA, for example between about 30 μA and about 50 μA, with the exact value depending on the device size and tunnel dielectric thickness. This will indicate the device has turned on. If current across the channel is less than about 10 μA, it indicates that polysilicon residue is blocking one of the source and the drain, but not both. If current across the channel is greater than about 100 μA, it indicates that polysilicon residue is blocking both of the source and drain. If back gate voltage is applied to an MOS transistor then its threshold voltage "$V_{th}$" increases. Threshold voltage for an OTP EPROM cannot be measured because there is no access to its gate. However, if a back gate voltage is applied to a programmed OTP EPROM, then its drain current decreases.

Thus if the above-described test structure indicates a functional PMOS transistor, indicated by the PMOS transistor passing both of test parameters "$I_{ds}$ off" and "$I_{ds}$ on," and a nonfunctional OTP EPROM, indicated by the failure of "I off" or "I on," it is likely that residual polysilicon is present and the wafer must be reworked or scrapped, or the wafer fabrication process must be adjusted to prevent residual polysilicon from remaining on the wafer.

Figure 8:
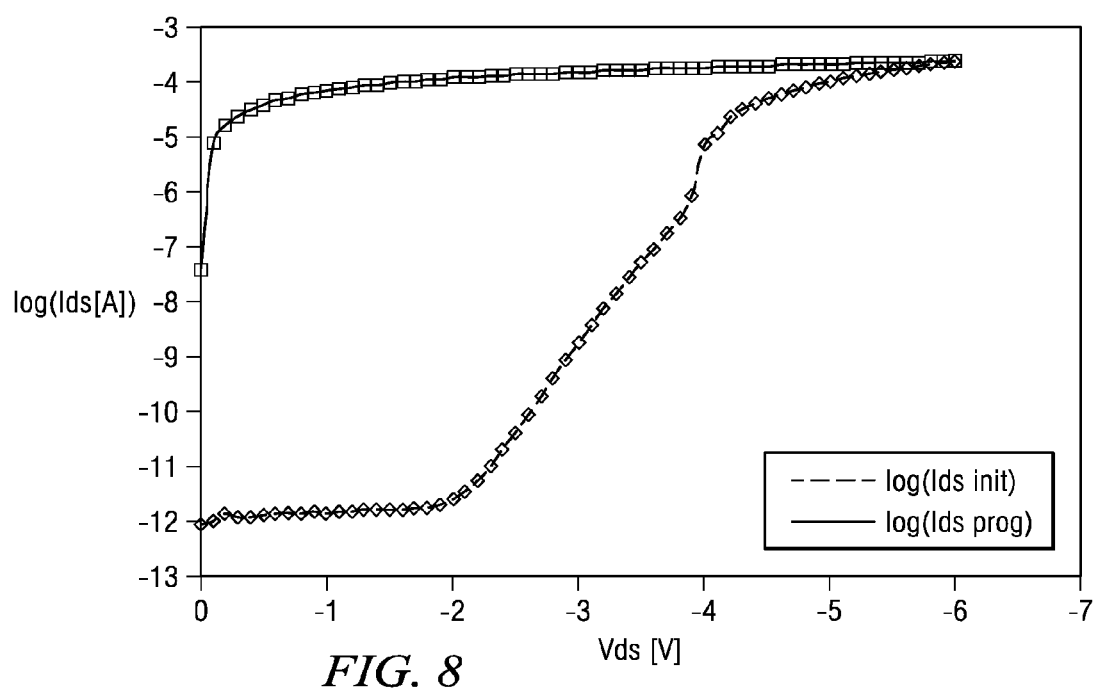
FIG. 8 is a graph of currents expected through the channel region with one embodiment of the invention for a one time programmable erasable programmable read-only memory (OTP EPROM) which does not have residual polysilicon.

FIG. 8 is a graph of currents expected through the channel region of a functional unprogrammed OTP EPROM and a functional OTP EPROM after programming of test structure 50. When a drain voltage lower than 2.0 V is applied to an unprogrammed (virgin) OTP EPROM, it does not conduct measurable current. When $V_d$ between 2.0 V and 4.0 V is applied, capacitive coupling between its drain and floating gate sufficiently high to cause subthreshold conduction, as $I_{ds}$ is in the picoamp to nanoamp range. At a drain voltage higher than 4.0 V, hot electrons are injected into the floating gate and $I_{ds}$ rapidly and irreversibly increases. Therefore, when $I_{ds}$ is subsequently measured (the plot marked "$I_{ds}$ prog" in FIG. 8) the OTP EPROM is turned ON because its floating gate is negatively charged.

Figure 9:
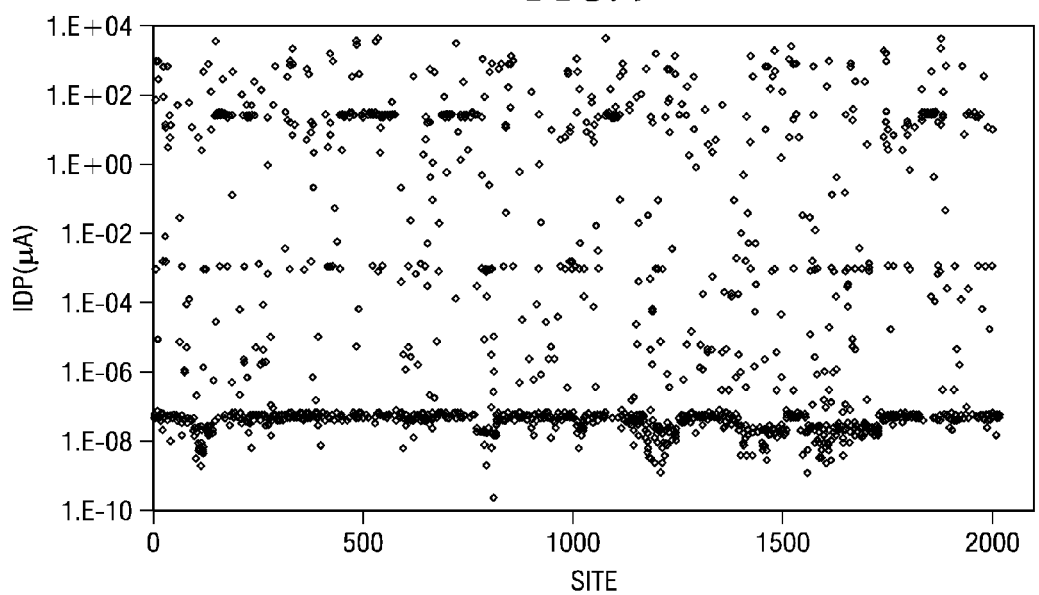
FIG. 9 is a graph depicting currents of OTP EPROM devices of a plurality of test structures on a semiconductor wafer exhibiting residual polysilicon.

FIG. 9 is a graph depicting currents of OTP devices of a plurality of test structures on a semiconductor wafer exhibiting residual polysilicon. In a wafer not exhibiting residual polysilicon, the drain current "$I_{dp}$" for each device would be in the range of about 10 μA to about 100 μA. In FIG. 9, a significant number of measured $I_{dp}$ ($V_{ds}$=−1V) currents are lower than 10 μA showing that many OTP EPROMs were not programmed or programmed only marginally. Further, a large number of $I_{dp}$ currents are less than 1 pA or 1 E-6 μA, suggesting that their source or drain contacts were blocked by residual polysilicon. Also, a number of $I_{dp}$ currents are higher than 100 μA, suggesting that their source and drain are shorted by residual polysilicon.

Figure 10:
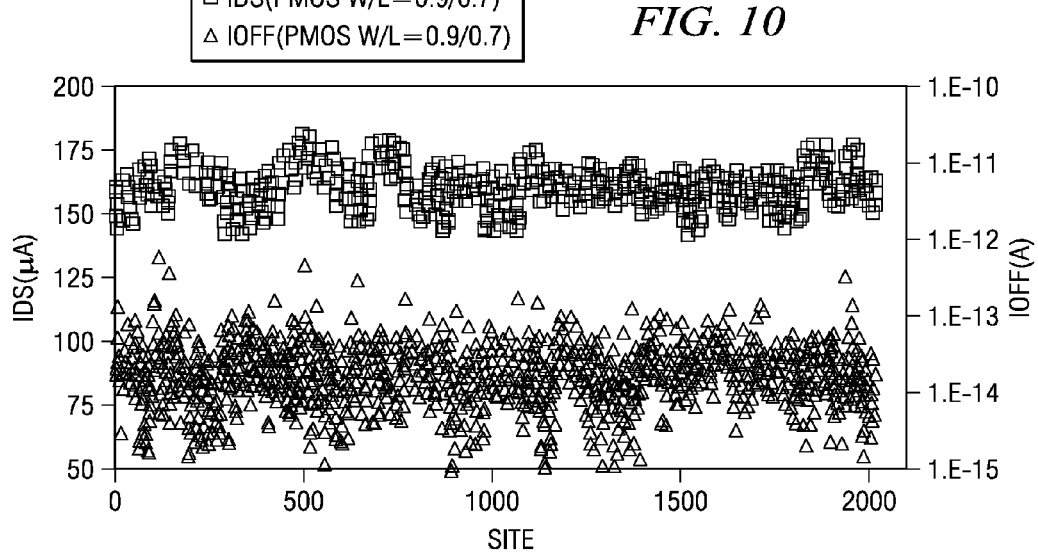
FIG. 10 is a graph depicting currents of PMOS transistors of a plurality of test structures on a semiconductor wafer exhibiting residual polysilicon.

FIG. 10 is a graph depicting currents of PMOS transistors of a plurality of test structures on a semiconductor wafer exhibiting residual polysilicon. These current ranges indicate functional PMOS transistors, as all "I off" values for the tested PMOS transistors are below 1 μA and all "I on" values are between 100 μA and 200 μA. Therefore, these wafers were processed correctly relative to the PMOS devices, and no problems are detected. Thus the combined graphs of FIGS. 9 and 10 indicate the OTP EPROMs have currents which are out of range (nonfunctional) and PMOS transistors which are functional, so that residual polysilicon overlying the wafer is indicated.

Again, if the $I_{ds}$ current for PMOS transistors on a semiconductor wafer is not within normal limits and the currents detected for "I off" and/or "I on" are out of range, a problem other than residual polysilicon is indicated.

Figure 11:
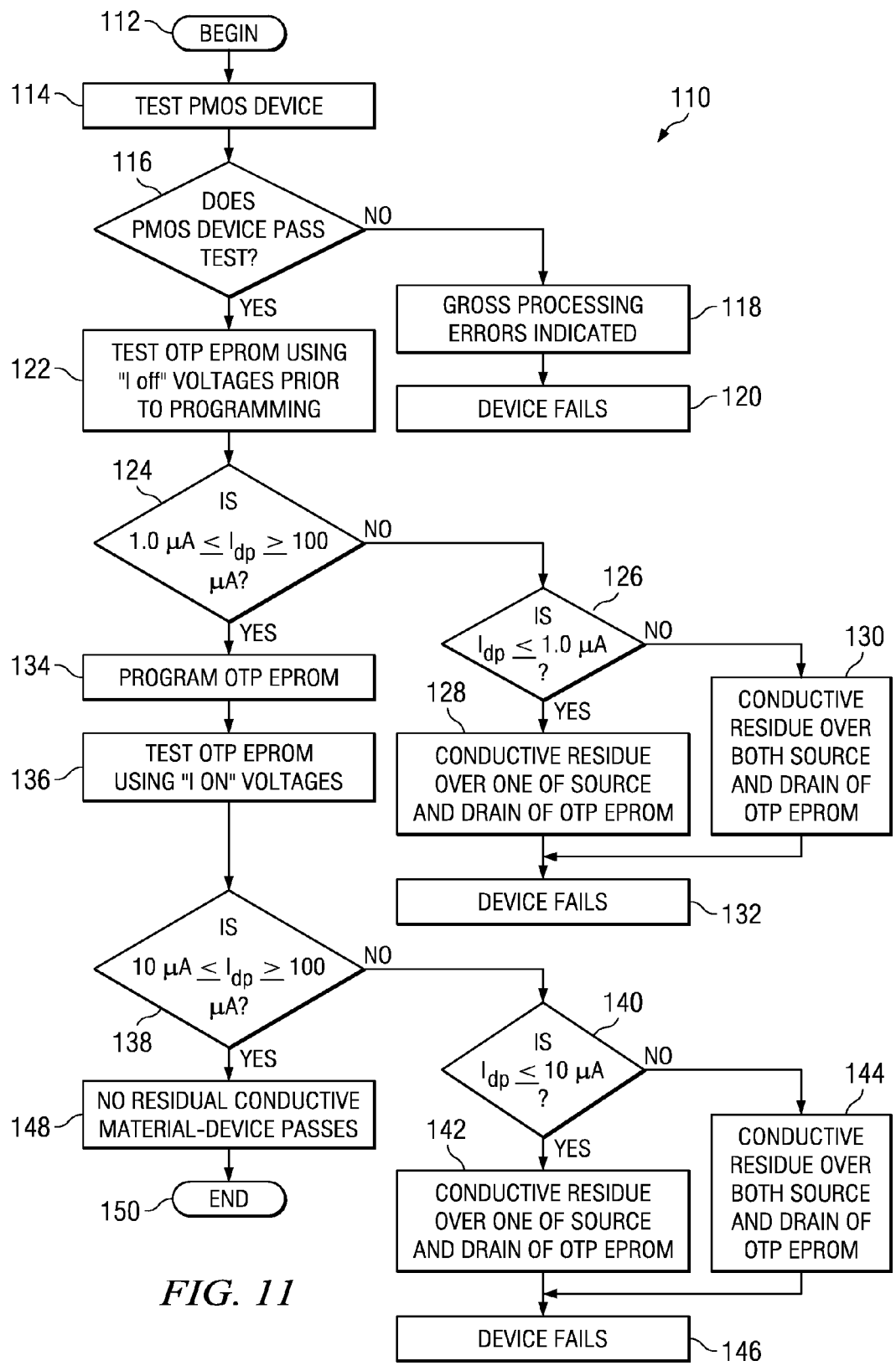
FIG. 11 is a flow chart depicting one exemplary embodiment of the invention.

FIG. 11 is a flow chart depicting one embodiment of the invention. The FIG. 11 flow charts lists currents which may result from the exemplary test voltages of Table 2, and are likely to vary with various device designs, for example devices having different tunnel dielectric thicknesses.

The FIG. 11 embodiment of the inventive process 110 which tests for residual conductive material begins 112 by testing the PMOS transistor 114, for example using the voltages "$I_{ds}$ on" and "$I_{ds}$ off" listed in Table 2. If the PMOS transistor does not pass testing 118, it is likely that gross processing errors are present on the device, and the device can be failed 120 then reworked or scrapped.

If the PMOS transistor passes, the OTP EPROM can be tested 122 prior to programming using the "I off" voltages listed in Table 2. It is then determined at 124 whether the $I_{dp}$ current resulting from the I off voltages are within specification, for example between about 1.0 μA and about 100 gμA. If $I_{dp}$ is less than about 1.0 μA 126, it is likely that conductive material such as silicide and/or polysilicon remains over only one of the source and drain 128 of the OTP EPROM. If $I_{dp}$ is greater than about 100 μA 130 it is likely that conductive material such as silicide and/or polysilicon remains over both of the source and drain of the OTP EPROM. In either case, the device can be failed 132 then reworked or scrapped.

If the OTP passes the test using I off voltages, the OTP EPROM can be programmed 134 using the "I prog" voltages listed in Table 2, and then tested 136 using the "I on" voltages. It is then determined at 138 whether the $I_{dp}$ current resulting from the I on voltages are within specification, for example between about 10 μA and about 100 μA. If $I_{dp}$ is less than about 10 μA 140, it is likely that conductive material such as silicide and/or polysilicon remains over only one of the source and drain 142 of the OTP EPROM. If $I_{dp}$ is greater than about 100 μA 144, it is likely that conductive material remains over both the source and drain of the OTP EPROM. In either case, the device can be failed 146 and then reworked or scrapped.

If both the PMOS transistor and the OTP EPROM device passes these tests using the test structure of FIG. 5, it is likely that no residual conductive material remains over the device, and the device passes 148, where process 110 ends 150.

The various exemplary embodiments of the inventive test structure and method described herein can be effective in detecting polysilicon residue which might remain subsequent to a polysilicon etch, particularly when forming small device features over uneven topography, for example during a LOCOS process. This test structure requires only a small area of the wafer, and provides a quick and reliable electrical test at a low cost. A plurality of test structures can be formed at different orientations over a semiconductor wafer, and can be formed in the wafer scribe area to minimize impact on wafer processing. It will be evident to one of ordinary skill in the art that the test structure can be used in main die technology development and production, supply chain management, integrated yield management, etc.

It should be understood that the test parameters can be applied in other sequences, and that the voltages and currents listed are merely exemplary for one particular device size and testing mode. Currents and voltages will change with varying device size, and a number of voltages and currents would function with a single test structure.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A method for testing a semiconductor device, comprising:
   providing a test structure comprising a MOS transistor and a floating gate transistor;
   applying voltages to the MOS transistor which are sufficient to activate a functional MOS transistor;
   applying voltages to the MOS transistor which are not sufficient to activate a functional MOS transistor;
   applying voltages to the floating gate transistor which are not sufficient to activate a functional unprogrammed floating gate transistor; then
   applying voltages to the floating gate transistor which are sufficient to program a functional floating gate transistor; then
   applying voltages to the floating gate transistor which are sufficient to activate a functional programmed floating gate transistor; and
   failing the semiconductor device for residual polysilicon across at least one of the source and drain of the floating gate transistor, if:
   a) the MOS transistor activates during the application of the voltages sufficient to activate a functional MOS transistor; or the MOS transistor does not activate during the application of the voltages which are not sufficient to activate a functional MOS transistor; and
   b) a current across a channel of the floating gate transistor is less than about 1.0 microamp (μA) during the application of voltages which are not sufficient to activate a functional unprogrammed floating gate transistor; a current across a channel of the floating gate transistor is more than about 200 μA during the application of voltages which are not sufficient to activate a function unprogrammed floating gate transistor; a current across a channel of the floating gate transistor is less than about 10 μA during the application of voltages which are sufficient to activate a functional programmed floating gate transistor; or a current across a channel of the floating gate transistor is more than about 100 μA during the application of voltages which are sufficient to activate a functional programmed floating gate transistor.

2. The method of claim 1, further comprising failing the semiconductor device for gross processing errors if the MOS transistor fails to activate during the application of the voltages sufficient to activate a functional MOS transistor, or if the MOS transistor activates during the application of the voltages which are not sufficient to activate a functional MOS transistor .

3. The method of claim 1, wherein the MOS transistor comprises a source, a drain, and a transistor gate; the floating gate transistor comprises a one time programmable floating gate transistor including a source, a drain, and a floating gate; and the provided test structure further comprises:
   at least a portion of a semiconductor wafer;
   a first probe contact electrically coupled with the source of the MOS transistor and the source of the floating gate transistor;
   a second probe contact electrically coupled with the drain of the MOS transistor;
   a third probe contact electrically coupled with the transistor gate of the MOS transistor;
   a fourth probe contact electrically coupled with the drain of the floating gate transistor; and
   a fifth probe contact electrically coupled with the semiconductor wafer.

4. The method of claim 3, wherein the test structure further comprises a back gate interposed between the MOS transistor and the floating gate transistor; and a sixth probe contact electrically coupled with the back gate.

5. The method of claim 3, wherein a width of the transistor gate being at least twice a width of the floating gate.

6. The method of claim 3, wherein the floating gate transistor has no control gate.

7. The method of claim 3, wherein the test structure further comprises a transistor contact which electrically couples the transistor gate to the third probe contact.

8. The method of claim 3, wherein the test structure further comprises a transistor contact which electrically couples the third probe contact to the transistor gate; and wherein the transistor gate has no other direct electrical connections.

9. The method of claim 3, wherein the test structure further comprises local oxidation of silicon (LOCOS) field dielectric interposed between the MOS transistor source and the floating gate transistor source.

10. A method for testing a semiconductor device, comprising:
   providing at least one test structure comprising:
      a p-type metal oxide semiconductor (PMOS) transistor;
      a one time programmable (OTP) erasable programmable read-only memory (EPROM) comprising a source, a drain, a channel, and a floating gate;
      providing a back gate interposed between the OTP EPROM and the PMOS transistor;
   testing the PMOS transistor for functionality;
   if the PMOS transistor is not functional, failing the semiconductor device;
   if the PMOS transistor is functional, prior to programming the OTP EPROM, applying a first test voltage comprising applying about −1.0 V to the OTP EPROM drain and about 0.0 V to both the back gate and the OTP EPROM source;
   if a current through the OTP EPROM channel during application of the first test voltage is less than about 1.0 microamp (μA) or more than about 100 μA, failing the semiconductor device;
   if current through the OTP EPROM channel during application of the first test voltage is between about 1.0 μA and about 100 μA, programming the OTP EPROM;

after programming the OTP EPROM, applying a second test voltage comprising about −1.0 V to the OTP EPROM drain and about 0.0 V to both the back gate and the OTP EPROM source; and if current through the OTP EPROM channel during application of the second voltage is less than about 10 μA or more than about 100 μA, failing the semiconductor device;

whereby testing tests for the presence of residual conductive material resulting from an underetch of a conductive layer.

11. The method of claim 10, further comprising failing the semiconductor device for comprising gross processing failures if the PMOS transistor is not functional.

12. The method of claim 10, further comprising:

failing the semiconductor device for comprising residual conductive material across only one of the source and drain of the OTP EPROM, if a current through the OTP EPROM channel during application of the first test voltage is less than about 1.0 microamp (μA); or failing the semiconductor device for comprising residual conductive material across both of the source and drain of the OTP EPROM, if a current through the OTP EPROM channel during the application of the first test voltage is more than about 100 μA.

13. The method of claim 10, further comprising:

failing the semiconductor device for comprising residual conductive material across only one of the source and drain of the OTP EPROM, if a current through the OTP EPROM channel during application of the second test voltage is less than about 10 μA; and failing the semiconductor device for comprising residual conductive material across both of the source and drain of the OTP EPROM, if a current through the OTP EPROM channel during the application of the second test voltage is more than about 100 μA.

14. A method for testing a semiconductor device, comprising:

providing a test structure comprising a MOS transistor and a floating gate transistor;

applying voltages to the MOS transistor which are sufficient to activate a functional MOS transistor;

applying voltages to the MOS transistor which are not sufficient to activate a functional MOS transistor;

applying voltages to the floating gate transistor which are not sufficient to activate a functional unprogrammed floating gate transistor; then applying voltages to the floating gate transistor which are sufficient to program a functional floating gate transistor; and then applying voltages to the floating gate transistor which are sufficient to activate a functional programmed floating gate transistor;

wherein the MOS transistor comprises a source, a drain, and a transistor gate; the floating gate transistor comprises a one time programmable floating gate transistor including a source, a drain, and a floating gate; and the provided test structure further comprises:

at least a portion of a semiconductor wafer;

a first probe contact electrically coupled with the source of the MOS transistor and the source of the floating gate transistor;

a second probe contact electrically coupled with the drain of the MOS transistor;

a third probe contact electrically coupled with the transistor gate of the MOS transistor;

a fourth probe contact electrically coupled with the drain of the floating gate transistor; and a fifth probe contact electrically coupled with the semiconductor wafer.

15. The method of claim 14, wherein the test structure further comprises a back gate interposed between the MOS transistor and the floating gate transistor; and a sixth probe contact electrically coupled with the back gate.

16. The method of claim 14, wherein the one time programmable floating gate transistor has no control gate.

17. The method of claim 14, wherein the test structure further comprises a transistor contact which electrically couples the transistor gate with the third probe contact.

18. The method of claim 14, wherein the test structure further comprises a transistor contact which electrically couples the third probe contact to the transistor gate, and the transistor gate has no other direct electrical connections.

19. The method of claim 14, wherein the test structure further comprises local oxidation of silicon (LOCOS) field dielectric interposed between the MOS transistor source and the floating gate transistor source.

* * * * *